(12) United States Patent
Hironaka et al.

(10) Patent No.: US 8,435,869 B2
(45) Date of Patent: May 7, 2013

(54) METHOD FOR MANUFACTURING SEMICONDUCTOR DEVICE

(75) Inventors: Misao Hironaka, Tokyo (JP); Harumi Nishiguchi, Tokyo (JP); Kyosuke Kuramoto, Tokyo (JP); Masatsugu Kusunoki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 213 days.

(21) Appl. No.: 12/862,829

(22) Filed: Aug. 25, 2010

(65) Prior Publication Data

US 2011/0183453 A1     Jul. 28, 2011

(30) Foreign Application Priority Data

Jan. 22, 2010  (JP) ................................ 2010-012257

(51) Int. Cl.
*H01L 21/00*     (2006.01)
(52) U.S. Cl.
USPC ..... 438/462; 438/107; 438/465; 257/E21.596
(58) Field of Classification Search .................. 438/107, 438/460, 462–463, 465; 257/E21.596
See application file for complete search history.

(56) References Cited

U.S. PATENT DOCUMENTS

| 7,544,588 B2 * | 6/2009 | Genda ........................... 438/462 |
| 7,572,657 B2 | 8/2009 | Yakushiji |
| 2007/0173036 A1 * | 7/2007 | Kusunoki ...................... 438/465 |
| 2009/0101927 A1 * | 4/2009 | Kohda ............................. 257/97 |

FOREIGN PATENT DOCUMENTS

| JP | 61-253829 A | 11/1986 |
| JP | 61-253830 A | 11/1986 |
| JP | 5-315646 A | 11/1993 |
| JP | 6-5703 A | 1/1994 |
| JP | 7-131069 A | 5/1995 |
| JP | 11-177137 A | 7/1999 |
| JP | 2003-218065 A | 7/2003 |
| JP | 2005-252245 A | 9/2005 |
| JP | 2005-333122 A | 12/2005 |
| JP | 2006-86516 A | 3/2006 |

OTHER PUBLICATIONS

State Intellectual Property Office of The People'S Republic of China, Office Action in Chinese Patent Application 201010502122.2 (Jul. 10, 2012).

* cited by examiner

*Primary Examiner* — Thanhha Pham
(74) *Attorney, Agent, or Firm* — Leydig, Voit & Mayer, Ltd.

(57) ABSTRACT

A method for manufacturing a semiconductor device includes forming a semiconductor laminated structure on a substrate as a wafer including semiconductor laser structures; forming a first groove between the semiconductor laser structures on a major surface of the wafer; separating the wafer to laser bars including at least two of the semiconductor laser structures arrayed in a bar shape, after forming the first groove; forming a second groove in the first groove of the laser bars, the second groove having a width no wider than the first groove; and separating one of the laser bars into respective semiconductor lasers along the second groove.

14 Claims, 8 Drawing Sheets

FIG. 15

METHOD FOR MANUFACTURING SEMICONDUCTOR DEVICE

BACKGROUND OF THE INVENTION

1. Field of the Invention

The present invention relates to a method for manufacturing a semiconductor device wherein a wafer is divided into a plurality of laser bars, and the laser bars are divided into individual semiconductor chips; more respectively to a method for manufacturing a semiconductor device that can improve the manufacturing efficiency thereof.

2. Background Art

When a wafer is divided into individual semiconductor chips, grooves for dividing are previously formed on the wafer, and cleaving or the like is performed. For forming the grooves, needle scribing, laser scribing, or the like is used. For example, since a shrunk chip, which has become small due to shrinkage, is difficult to split, the chips are more difficult to be divided than before shrinking. In order to facilitate dividing, deep grooves are required. However, since there is a limit in needle scribing, and laser scribing generates debris, a problem wherein considerably deep grooves cannot be formed is caused.

To solve such a problem, there has been proposed a method wherein a groove is formed in a wafer, and break lines are formed by laser irradiation in the groove (for example, refer to Japanese Patent Application Laid-Open No. 11-177137).

SUMMARY OF THE INVENTION

When a semiconductor laser or the like is manufactured, a wafer is first divided into a plurality of laser bars. Next, the formation of protective films on and surfaces of respective laser bars or the like is performed. Thereafter, the respective laser bars are separated into individual semiconductor chips. If conventional methods are applied to the separation, the grooves and break lines must be formed of respective laser bars, and a problem of low manufacturing efficiency is caused.

To solve the problem as described above, it is an object of the present invention to obtain a method for manufacturing a semiconductor device that can improve manufacturing efficiency.

According to the present invention, a method for manufacturing a semiconductor device comprises: forming a semiconductor laminate structure on a substrate so as to form a wafer including a plurality of semiconductor lasers; forming a first groove between the semiconductor lasers on a major surface of the wafer; separating the wafer to laser bars wherein the semiconductor lasers are arrayed in bar shape after forming the first groove; forming a second groove in the first groove of the laser bars, a width of the second groove being identical to or narrower than a width of the first groove; and separating the laser bar into respective semiconductor lasers along the second groove.

The present invention makes it possible to improve the manufacturing efficiency thereof.

Other and further objects, features and advantages of the invention will appear more fully from the following description.

DETAILED DESCRIPTION OF THE PREFERRED EMBODIMENTS

First Embodiment

The method for manufacturing a semiconductor device according to the first embodiment will be described referring to the drawings. FIGS. 1, 3, and 5 to 7 are top views for illustrating the method for manufacturing a semiconductor device according to the first embodiment; and FIGS. 2, 4, 8, and 9 are sectional views thereof.

Figure 1:
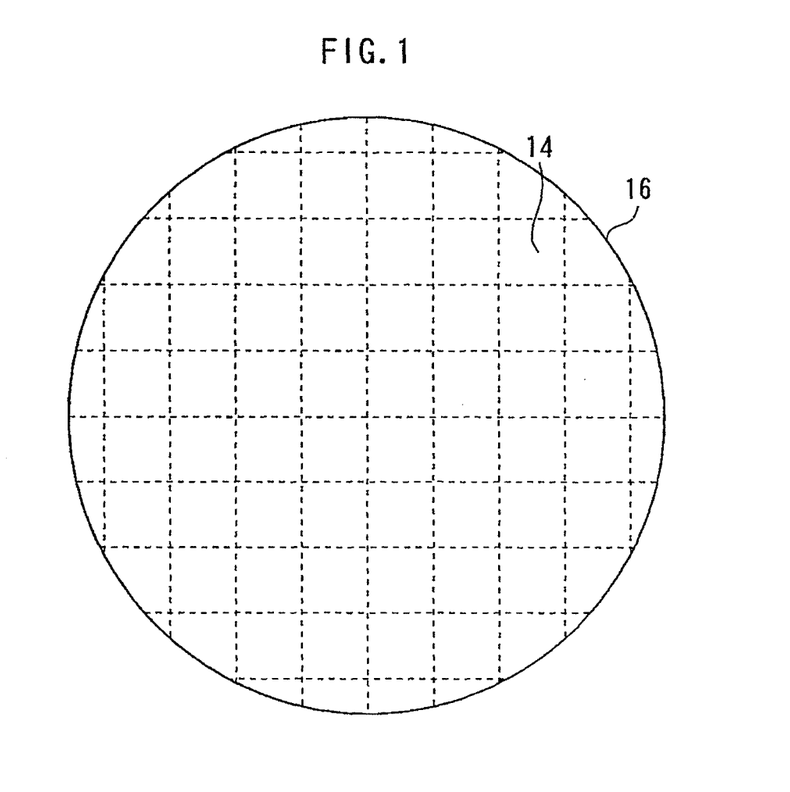
FIGS. 1, 3, and 5 to 7 are top views for illustrating the method for manufacturing a semiconductor device according to the first embodiment.
Figure 2:
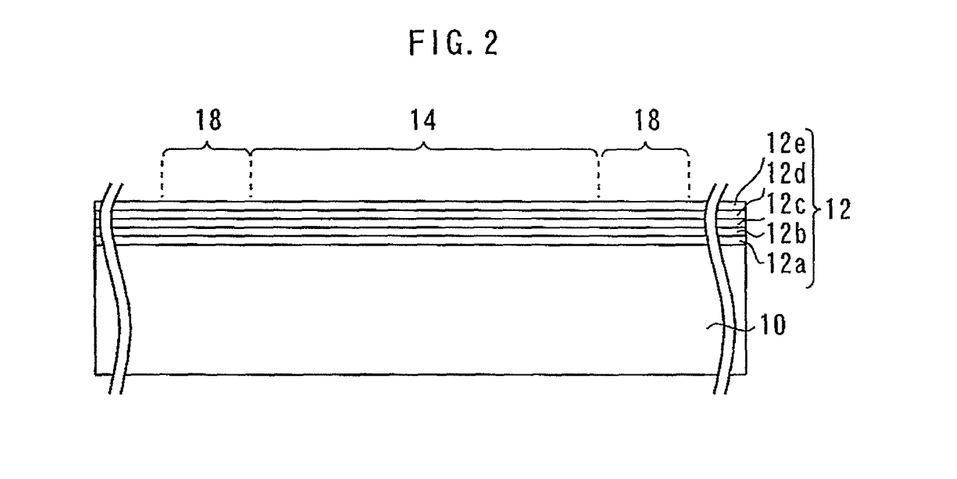
FIGS. 2, 4, 8, and 9 are sectional views for illustrating the method for manufacturing a semiconductor device according to the first embodiment.

First, as shown in FIGS. 1 and 2, a semiconductor laminate structure 12 is formed on the major surface of a wafer-shaped n-type GaN substrate 10 (substrate). The semiconductor laminate structure 12 has an n-type AlGaN layer 12a, an n-type GaN layer 12b, an InGaN/AlGaN active layer 12c, a p-type AlGaN layer 12d, and a p-type GaN layer 12e sequentially laminated from the n-type GaN substrate 10 side. Thereby, a wafer 16 having a plurality of semiconductor lasers 14 is formed. A semiconductor laser 14 is composed of the n-type GaN substrate 10 and the semiconductor laminate structure 12. Between the semiconductor lasers 14, a separating region 18 for separating the semiconductor lasers 14 is present.

Figure 3:
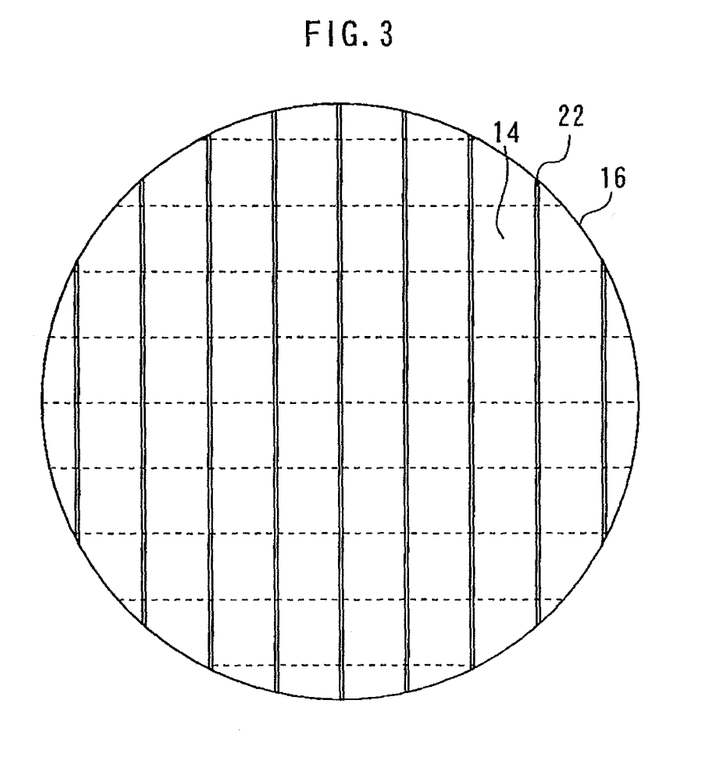
Figure 4:
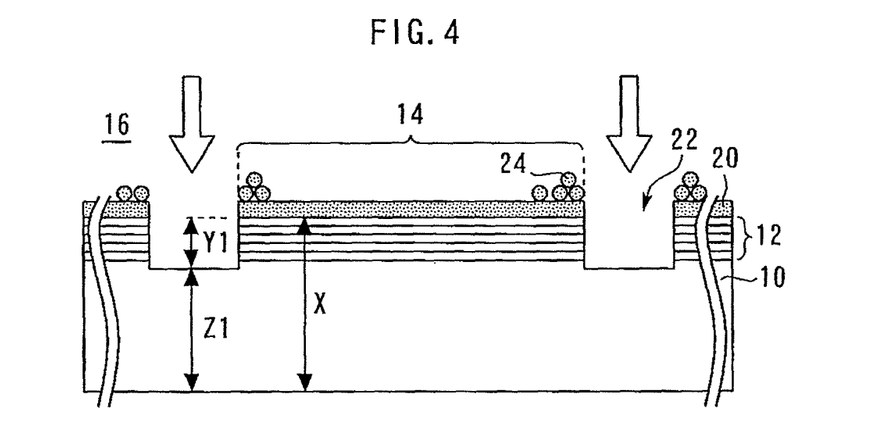

Next, as shown in FIGS. 3 and 4, a protective film 20 composed of photo-resist or the like is formed on the major surface of the wafer 16 other than the separating region 18. A first groove 22 is formed on the separating region 18 between the semiconductor lasers 14 of the major surface of the wafer 16 by the radiation of laser beams (laser scribing). Thereafter, the protective film 20 is removed. At this time, if the laser beams are radiated on the protective film 20, a thermo-chemical reaction in the photo-resist or the like due to heat generation produces a protective film, which is difficult to remove in subsequent processes; therefore, the laser beams should not be radiated on the protective film 20.

Here, laser scribing is a method for melting and evaporating the semiconductor by the radiation of laser beams. By the radiation of laser beams, contaminants 24 such as debris are produced. Since the semiconductor lasers 14 are covered with the protective film 20, no contaminants 24 are directly adhered on the surface of the semiconductor lasers 14. Therefore, the surfaces of the semiconductor lasers 14, after the removal of the protective film 20, are clean.

When the total value of the thickness of the n-type GaN substrate 10 and the semiconductor laminate structure 12 is referred to as the total thickness X, and the thinner one of 30% of the total thickness X or 30 μm is referred to as the critical thickness, the left thickness Z1 wherein the depth Y1 of the first groove 22 is deducted from the total thickness X should be equal to the critical thickness or thicker. For example, when the total thickness X is 100 μm, the left thickness Z1 should be 30 μm or thicker. As described above, since the first groove 22 is shallow, it is difficult to divide the n-type GaN substrate 10 along the first groove 22.

Figure 5:
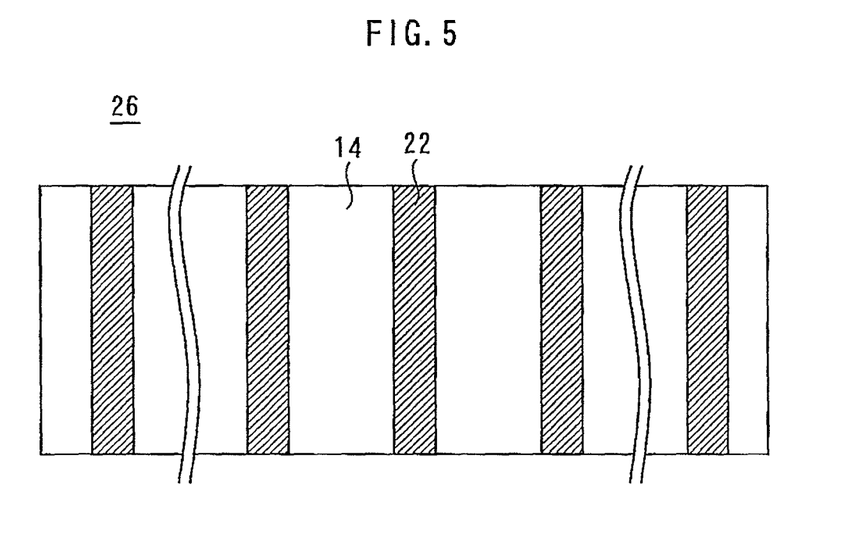
Figure 6:
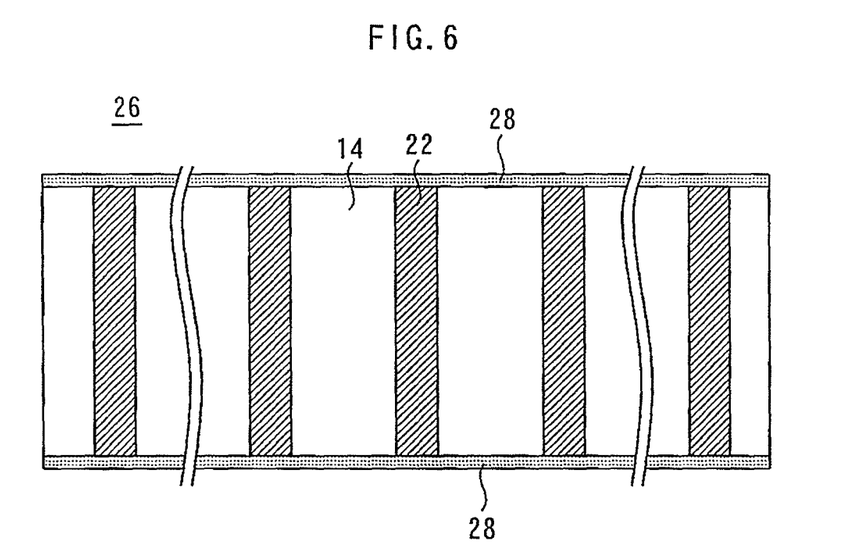

Next, as shown in FIG. 5, by the cleaving process for forming the end surfaces of the resonator required for laser-beam generation, the wafer 16 is separated to laser bars 26 wherein semiconductor lasers 14 are arrayed in the bar shape. Then, as shown in FIG. 6, reflective films 28 are formed on the end surfaces of the resonators of the semiconductor lasers 14.

Figure 7:
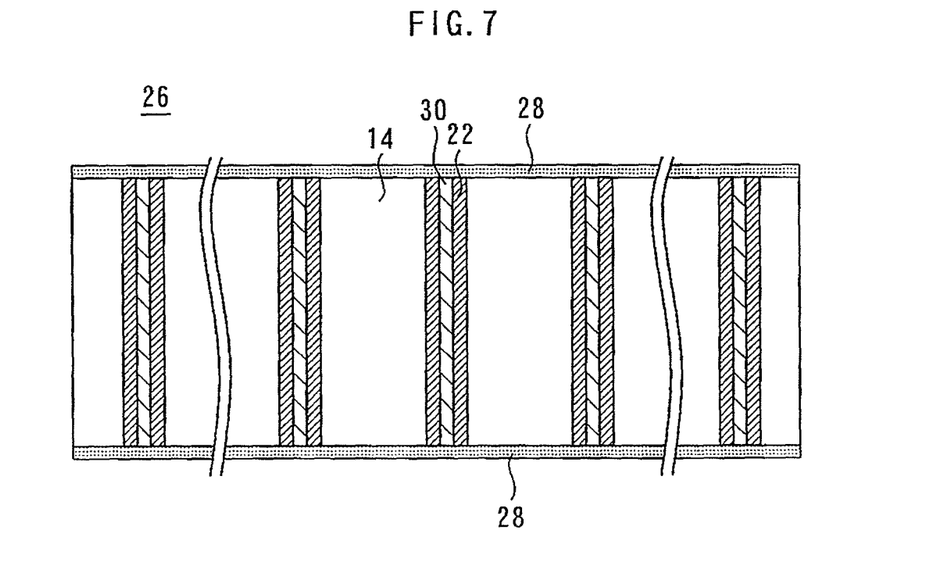
Figure 8:
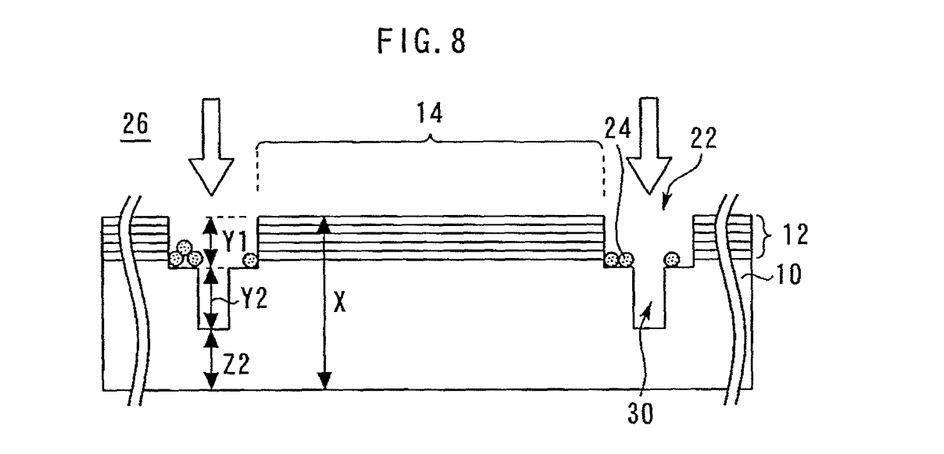

Next, as shown in FIGS. 7 and 8, second grooves 30 are formed in the first grooves 22 of the laser bars 26 by the radiation of laser beams. Each of the second grooves 30 has a width narrower than the first groove 22. At this time, the conditions of laser-beam radiation is determined so that the contaminants 24 produced by the radiation of laser beams are present only in the first groove 22. The conditions for laser irradiation include the intensity of laser irradiation, the spot size at the time of laser irradiation, and the sweeping speed for laser irradiation. Thereby, the scatter of contaminants 24 onto the surface of laser bars 26 outside the first groove 22 can be prevented. The width of the second groove 30 may be identical to the width of the first groove 22.

In addition, the left thickness Z2, wherein the total value of the depth Y1 of the first groove 22 and the depth Y2 of the second groove 30 is deducted from the total thickness X, is made smaller than the critical thickness. For example, when the total thickness X is 100 μm, the left thickness Z2 is 30 μm or smaller. Thereafter, the laser bar 26 is placed on a base having a vacant horizontal void with the second groove 30 down. Then, by applying a weight onto the surface opposite to the second groove 30 of the laser bar 26, the laser bar 26 is separated into respective semiconductor lasers 14 along the second groove 30. For example, the horizontal width of the void is 350 μm, and the weight applied onto the laser bar 26 is about 90 g. Specifically, since the second groove 30 is sufficiently deep, the semiconductor lasers 14 can be easily separated by a small weight.

As described above, according to the present embodiment, since a deep groove can be formed in two stages, the separation performance of the semiconductor chip can be improved, and the yield can be elevated.

In addition, according to the present embodiment, the first groove 22 is formed in a wafer state in a lump. Thereby, the manufacturing efficiency can be improved in comparison with conventional techniques wherein the first groove 22 is formed for each laser bar 26.

Figure 9:
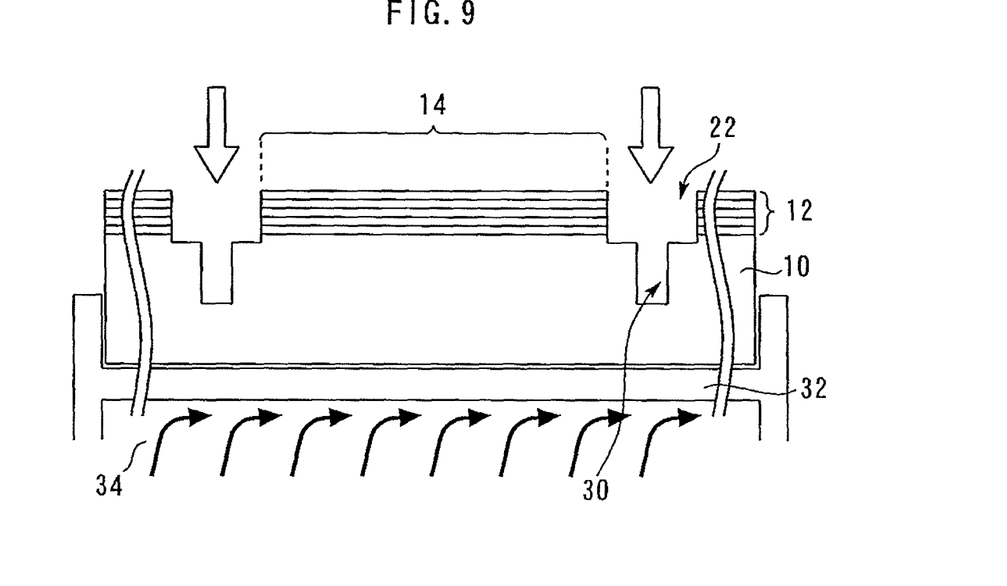

It is preferable that the n-type GaN substrate 10 is cooled when laser beams are radiated for forming the first groove 22 or the second groove 30. For example, as shown in FIG. 9, a water-cooling mechanism 34 is provided on the reverse surface of a stage 32 where the n-type GaN substrate 10 is placed. Thereby, adverse effects such as damage to the protective film 20 or the semiconductor lasers 14 due to heat generated during laser irradiation can be reduced.

In addition, although the first groove 22 or the second groove 30 is formed by one irradiation of laser beams in the present embodiment, a plurality of irradiations of laser beam can be performed onto the same site. Thereby, damages to the semiconductor device caused by heat or stress or the like generated by each irradiation of laser beams can be reduced.

Although the first groove 22 and the second groove 30 are formed by the irradiation of laser beams in the present embodiment, the first groove 22 or the second groove 30 may be formed by needle scribing.

Figure 10:
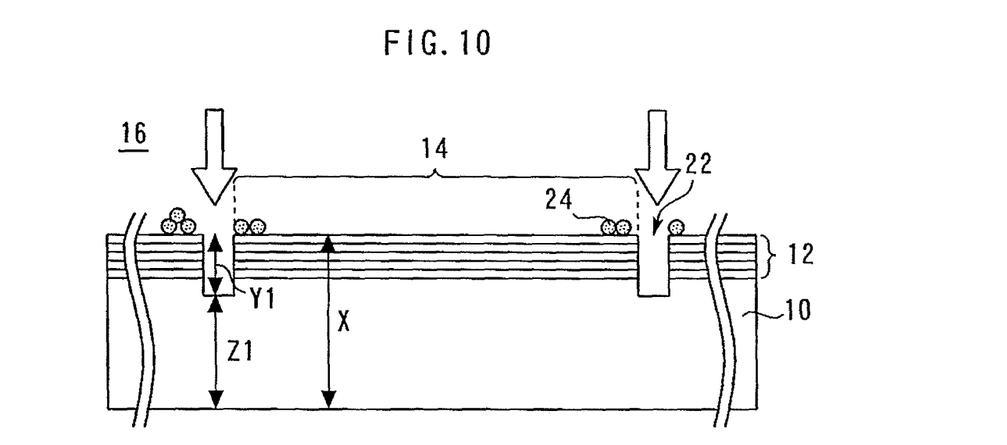
FIGS. 10 and 11 are sectional views for illustrating the method for manufacturing a semiconductor device according to the second embodiment.
Figure 11:
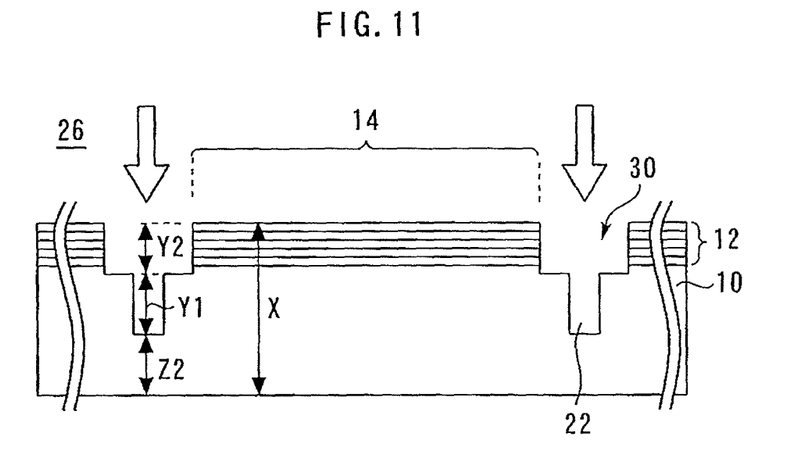

As the semiconductor substrate, a semiconductor substrate such as a silicon substrate, a gallium arsenide substrate, an substrate, and a nitride-based compound semiconductor substrate, or an insulating substrate such as a sapphire substrate can be used. Since the nitride-based compound semiconductor substrate is more difficult to break than other substrates, and chip separation is difficult, the manufacturing method according to the present embodiment is especially effective.
Second Embodiment A method for manufacturing a semiconductor device according to the second embodiment will be described referring to the drawings. FIGS. 10 and 11 are sectional views for illustrating the method for manufacturing a semiconductor device according to the second embodiment. Constituents identical to or corresponding to the constituents of the first embodiment will be denoted with the same numerals, and the description thereof will be omitted.

First, in the same manner as in the first embodiment, a wafer 16 having a plurality of semiconductor lasers 14 is formed by forming a semiconductor laminate structure 12 on the major surface of a wafer-shaped n-type GaN substrate 10.

Next, as shown in FIG. 10, a first groove 22 is formed on the major surface of the wafer 16 in the separating region 18 between semiconductor lasers 14 by the irradiation of laser beams. At this time, in the same manner as in the first embodiment, left thickness Z1 wherein the depth Y1 of the first groove 22 is deducted from the total thickness X should be equal to the critical thickness or thicker.

Next, in the same manner as in the first embodiment, the wafer 16 is divided into laser bars 26. Then, as shown in FIG. 11, a second groove 30 having a larger width than the first groove 22 is formed on the laser bar 26 by the irradiation of laser beams so as to include the first groove 22 therein. The first groove 22 is located on the base surface of the second groove 30.

Also, in the same manner as in the first embodiment, the left thickness Z2, wherein the total value of the depth Y1 of the first groove 22 and the depth Y2 of the second groove 30 is deducted from the total thickness X is made smaller than the critical thickness. Thereafter, the laser bar 26 is separated into respective semiconductor lasers 14 along the second groove 30 including the first groove 22 therein.

As described above, since the first groove 22 is formed in a wafer state in a lump also in the present embodiment, the effects equivalent to the effects of the first embodiment can be obtained.

Figure 12:
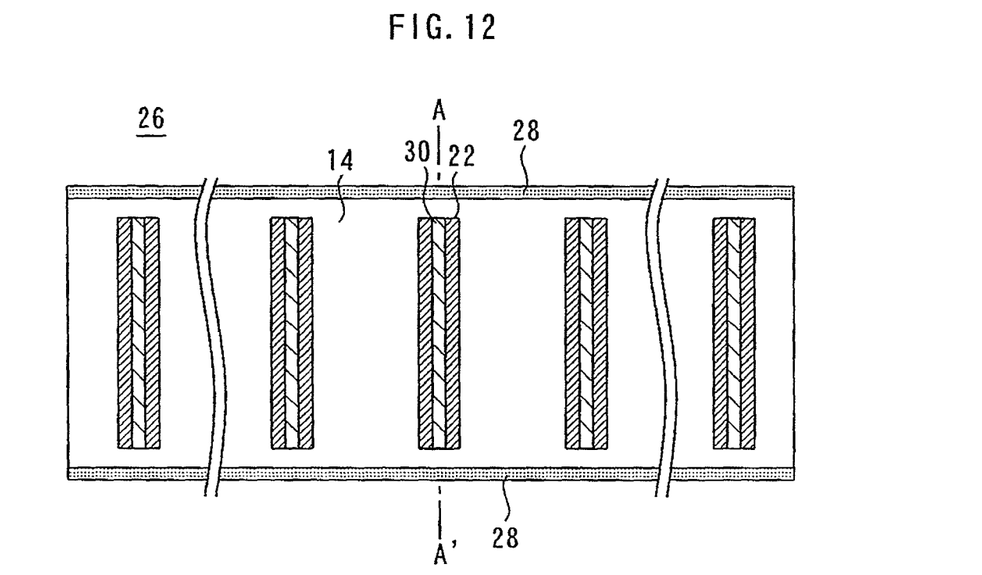
FIG. 12 is a top view for illustrating the method for manufacturing a semiconductor device according to the third embodiment.
Figure 13:
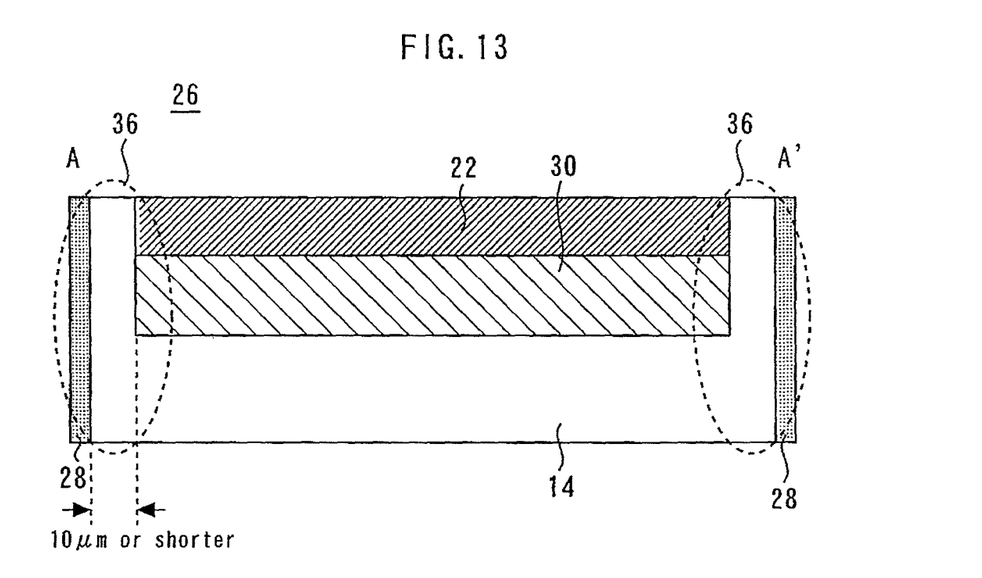
FIG. 13 is a sectional view taken along the A-A' line in FIG. 12.

In addition, in the present embodiment, the second groove 30 having a larger width than the first groove 22 is formed so as to include the first groove 22 therein. Thereby, the contaminants 24 produced by the irradiation of laser beams when the first groove 22 is formed and adhered in the vicinity of the first groove 22 can be removed by the irradiation of laser beams when the second groove 30 is formed. Therefore, the cleanness of the surfaces of the semiconductor lasers 14 is elevated.
Third Embodiment A method for manufacturing a semiconductor device according to the third embodiment will be described referring to the drawings. FIG. 12 is a top view for illustrating the method for manufacturing a semiconductor device according to the third embodiment; and FIG. 13 is a sectional view taken along the A-A' line in FIG. 12. The constituents identical to or corresponding to the constituents of the first embodiment will be denoted with the same numerals, and the description thereof will be omitted.

When the second groove 30 of formed by needle scribing in the first or second embodiment, if the second groove 30 is formed to the end surface of the resonator, cracks are produced on the end surface of the resonator. On the other hand, when the second groove 30 is formed by the irradiation of laser beams, if the second groove 30 is formed to the end surface of the resonator, contaminants, such as debris, are adhered to the end surface of the resonator.

Whereas, according to the present embodiment, as shown in FIGS. 12 and 13, the first groove 22 and the second groove 30 are not formed in the vicinity region 36 of the end surface of the resonator in semiconductor lasers 14 included in the laser bar 26. The length of the vicinity region 36 from the end surface of the resonator of the semiconductor lasers 14 to the second groove 30 is 10 μm or shorter. In addition, if the first groove 22 is sufficiently shallow, the first groove 22 can be formed within the vicinity region 36. Other constitutions are the same as the constitutions of the first or second embodiment.

Figure 14:
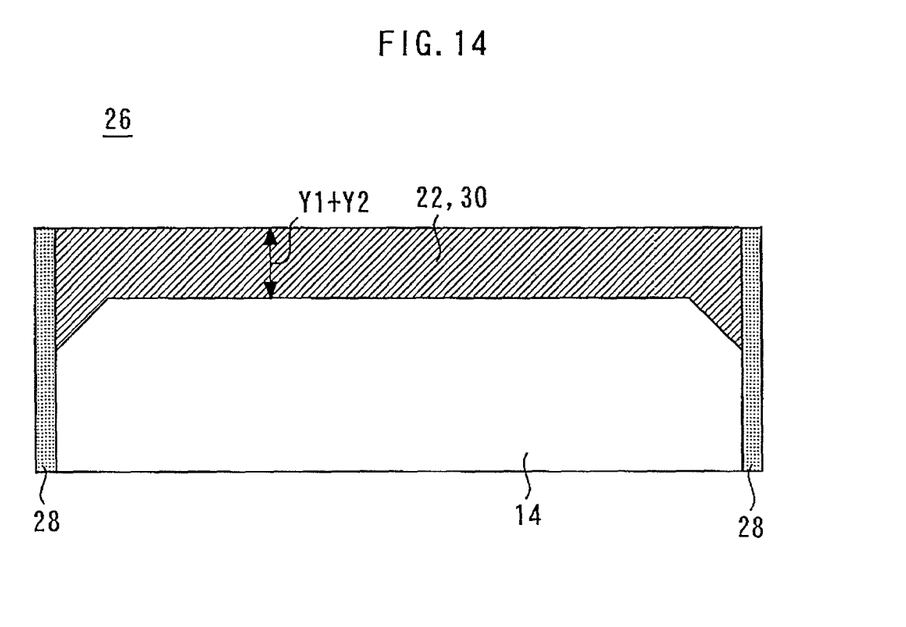
FIG. 14 is a sectional view for illustrating the method for manufacturing a semiconductor device according to the fourth embodiment.
Figure 15:
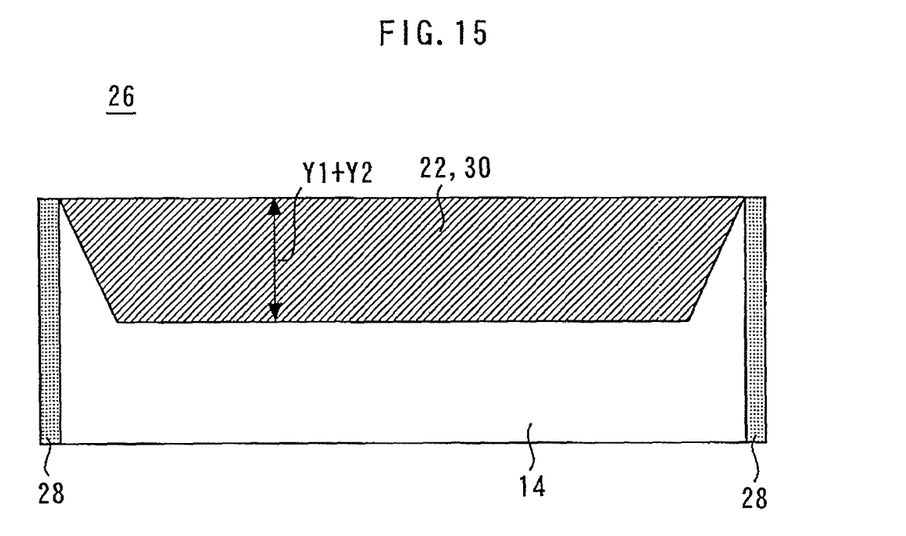
FIG. 15 is a sectional view for illustrating the method for manufacturing a semiconductor device according to the fifth embodiment.

Thereby, cracks in the end surface of the resonator due to needle scribing, or the adhesion of contaminants onto the end surface of the resonator due to laser scribing can be prevented.
Fourth Embodiment A method for manufacturing a semiconductor device according to the fourth embodiment will be described referring to the drawings. FIG. 14 is a sectional view for illustrating the method for manufacturing a semiconductor device according to the fourth embodiment. The constituents identical to or corresponding to the constituents of the first embodiment will be denoted with the same numerals, and the description thereof will be omitted.

As shown in FIG. 14, the total value of the depth Y1 of the first groove 22 and the depth Y2 of the second groove 30 is varied along the resonator direction of the semiconductor laser 14, and is relatively large in the vicinity of the end surface of the resonator of the semiconductor lasers 14. Other constitutions are the same as the constitutions of the first or second embodiment. Thereby, when the laser bar 26 is separated into respective semiconductor lasers 14, the separation work becomes easier, and the yield is improved.
Fifth Embodiment A method for manufacturing a semiconductor device according to the fifth embodiment will be described referring to the drawings. FIG. 15 is a sectional view for illustrating the method for manufacturing a semiconductor device according to the fifth embodiment. The constituents identical to or corresponding to the constituents of the first embodiment will be denoted with the same numerals, and the description thereof will be omitted.

As shown in FIG. 15, the total value of the depth Y1 of the first groove 22 and the depth Y2 of the second groove 30 is varied along the resonator direction of the semiconductor laser 14, and is relatively small in the vicinity of the end surface of the resonator of the semiconductor lasers 14. Other constitutions are the same as the constitutions of the first or second embodiment. Thereby, the contamination of the end surface of the resonator by debris, cracks, contaminants or the like produced in the processes of forming the grooves can be prevented. The present embodiment is particularly effective when problems are caused in the reliability or appearance of the product by such contaminations of end surface portions.

In the fourth and fifth embodiments, either one of the depth Y1 of the first groove 22 and the depth Y2 of the second groove 30 may be varied along the resonator direction, or the both depths may be varied along the resonator direction. Furthermore, which of fourth and fifth embodiments is adopted, and the design value of the depth of the groove are selected from the relation between the ease of semiconductor laser dividing and the quantity of contaminants during the formation of the groove.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-012257, filed on Jan. 22, 2010 including specification, claims, drawings and summary, on which the Convention priority of the present application is based, are incorporated herein by reference in its entirety.

What is claimed is:

1. A method for manufacturing a semiconductor device comprising:
    forming a semiconductor laminated structure on a substrate, wherein the semiconductor laminated structure includes a plurality of semiconductor laser structures;
    forming first grooves, wherein each of the first grooves has a first depth and a first width in the semiconductor laminated structure, and is located between a pair of the semiconductor laser structures;
    after forming the first grooves, separating the substrate, along directions transverse to the first grooves, into laser bars, wherein each laser bar includes at least two of the semiconductor laser structures and has opposed side surfaces transverse to resonators of the semiconductor laser structures in the laser bars;
    forming respective second grooves in the first grooves of a first laser bar of the laser bars, wherein each of the second grooves has a second depth and a second width, the second grooves being transverse to the opposed side surfaces of the first laser bar and spaced apart from the opposed side surfaces of the first laser bar; and
    dividing the first laser bar into respective semiconductor lasers along the first and second grooves.

2. The method for manufacturing a semiconductor device according to claim 1, further comprising:
    before forming the first groove, forming a protective film on the surface of the semiconductor laminated structure except for portions of the surface of the semiconductor laminated structure where the first grooves are to be formed;
    forming the first grooves by irradiation of the surface of the semiconductor laminated structure, where not covered by the protective film, with a first laser beam; and
    removing the protective film from the surface of the semiconductor laminated structure after forming the first grooves.

3. The method for manufacturing a semiconductor device according to claim 2, including cooling the substrate while the semiconductor laminated structures are being irradiated with the first laser beam.

4. The method for manufacturing a semiconductor device according to claim 2, including forming the second grooves by irradiation of the laser bar with a second laser beam.

5. The method for manufacturing a semiconductor device according to claim 4, including cooling the substrate while the semiconductor laminated structures are being irradiated with the first and second laser beams.

6. The method for manufacturing a semiconductor device according to claim 1, wherein separation of the side surfaces of the first laser bar from respective second grooves is no more than 10 μm.

7. The method for manufacturing a semiconductor device according to claim 1, wherein the first depth plus the second depth varies along the resonators of the semiconductor laser structures of the first laser bar, and is larger proximate the opposed side surfaces of the first laser bar than elsewhere in the first laser bar.

8. The method for manufacturing a semiconductor device according to claim 1, wherein the first depth plus the second depth varies along the resonators of the semiconductor laser structures of the first laser bar, and is smaller proximate the opposed side surfaces of the first laser bar than elsewhere in the first laser bar.

9. The method for manufacturing a semiconductor device according to claim 1, wherein
the substrate and the semiconductor laminated structures have a total thickness defined as x,
the thinner of (i) 30% of the total thickness x, and (ii) 30 μm, is defined as a critical thickness, and
the method further comprises
forming the first grooves so that the first depth, when deducted from the total thickness x, leaves a remaining thickness that is equal to or larger than the critical thickness, and
forming the second grooves so that the first depth plus the second depth, when deducted from the total thickness x, leaves a remaining thickness that is smaller than the critical thickness.

10. The method for manufacturing a semiconductor device according to claim 1, wherein the substrate is a nitride-based compound semiconductor.

11. The method for manufacturing a semiconductor device according to claim 1, wherein the second width is no wider than the first width.

12. The method for manufacturing a semiconductor device according to claim 11, including forming the second grooves by irradiation of the laser bar with a second laser beam, using conditions of irradiation so that contaminants produced by the irradiation with the second laser beam are confined to the first grooves.

13. The method for manufacturing a semiconductor device according to claim 1, further comprising, before forming the second grooves, forming reflective films on the opposed side surfaces of the first laser bar.

14. The method for manufacturing a semiconductor device according to claim 1, wherein
the substrate and the semiconductor laminated structures have a total thickness defined as x, and
the method further comprises
forming the first grooves so that the first depth, when deducted from the total thickness x, leaves a remaining thickness that is equal to or larger than a predetermined critical thickness, and
forming the second grooves so that the first depth plus the second depth, when deducted from the total thickness x, leaves a remaining thickness that is smaller than the predetermined critical thickness.

* * * * *